United States Patent [19]

Sakai et al.

[11] Patent Number: 4,717,948
[45] Date of Patent: Jan. 5, 1988

[54] SEMICONDUCTOR DEVICE

[75] Inventors: Kunito Sakai; Akinobu Tamaki; Takashi Takahama, all of Amagasaki, Japan

[73] Assignee: Mitsubishi Denki Kabushiki Kaisha, Japan

[21] Appl. No.: 576,882

[22] Filed: Feb. 3, 1984

[30] Foreign Application Priority Data

Mar. 18, 1983 [JP] Japan .................. 58-46153

[51] Int. Cl.⁴ .................. H01L 23/02; H01L 23/12
[52] U.S. Cl. .................. 357/74; 357/80; 357/84
[58] Field of Search .................. 357/74, 80, 84

[56] References Cited

U.S. PATENT DOCUMENTS

| | | | |
|---|---|---|---|
| 3,846,222 | 11/1974 | Dietz | 161/162 |
| 4,105,861 | 8/1978 | Hascoe | 357/74 |
| 4,126,758 | 11/1978 | Krumme | 357/74 |
| 4,267,565 | 5/1981 | Puppolo et al. | 357/74 |
| 4,363,076 | 12/1982 | McIver | 361/386 |
| 4,412,093 | 10/1983 | Wildeboer | 357/74 |
| 4,480,262 | 10/1984 | Butt | 357/74 |
| 4,482,781 | 11/1984 | Burns | 357/74 |
| 4,524,238 | 6/1985 | Butt | 357/74 |

FOREIGN PATENT DOCUMENTS

| | | |
|---|---|---|
| 57-76867 | 10/1980 | Japan . |
| 59-191358 | 4/1983 | Japan . |
| 58-48441 | 9/1983 | Japan . |
| 2055508 | 7/1980 | United Kingdom . |

OTHER PUBLICATIONS

Chemical Abstracts, vol. 88, 1978, 57569.
"New Techniques in Encapsulation of Semiconductors with Plastics," International Microelectron, pp. 48–49, (1976), USA; Author: John Hull, Hull Corporation.
"A Study of Properties of Plastics Used for Semiconductor Encapsulation", Journal of Electronic Materials, vol. 6, No. 3, pp. 319–322, (1977); Authors: Anh Quach and W. L. Hunter, Motorola, Inc.

*Primary Examiner*—William L. Sikes
*Assistant Examiner*—Robert E. Wise
*Attorney, Agent, or Firm*—Lowe, Price, Leblanc, Becker & Shur

[57] ABSTRACT

A semiconductor device includes an electronic component in a hollow portion provided between two packing members each comprising a laminated structure. A laminated structure has a metallic layer and an insulating layer. The laminated structure can further have a reinforcing layer. One end surface of the laminated structure is an insulating layer. The insulating layers of these laminated structures oppose each other with peripheral portions thereof hermetically connected, so that the hollow portion containing the electronic component is airtight. A metallic layer is formed of a metal such as aluminum or an alloy thereof, an insulating layer is formed of organic material and the like and a reinforcing layer is formed of a fiber, a thermosetting resin, a thermoplastic resin and the like. The electronic component contained in the hollow portion is positioned to avoid contact with the packing members. The electronic component is electrically connected to the exterior through lead wires interposed between the contact surfaces of the two packing members.

5 Claims, 7 Drawing Figures

SEMICONDUCTOR DEVICE

BACKGROUND OF THE INVENTION

1. Field of the Invention

The present invention relates to a semiconductor device and particularly to a semiconductor device comprising packing members for protecting semiconductor elements and other electronic components from the external environment.

2. Description of the Prior Art

In general, a semiconductor device comprises a structure in which semiconductor elements and electronic components such as an integrated circuit (referred to hereinafter as an IC), transistors, diodes, capacitors, resistors, a hybrid IC, microcoils, etc. are provided on one substrate or more. A semiconductor device comprising such elements and components is normally of considerably small size and as a result, is liable to undergo physical or chemical changes due to the external environment. In order to prevent such changes and assure stability and long life, a semiconductor device is normally provided with protecting means. Such protecting means is formed so as to wrap the semiconductor elements and electronic components, for the purpose of protection.

One conventional protecting means widely utilized is formed by an airtight sealing method, in which metal or ceramic is used. A notable increase of production of semiconductor devices in these days has led to the use of a resin sealing method utilizing organic materials, instead of the above mentioned airtight sealing method. With resin sealing, a transfer molding method is applied in which a molding material heated and softened in advance is compressed into a heated metallic mold by means of a press. As the molding material for use in this transfer molding method, epoxy resin or silicone resin mixed with a curing agent, a bulking agent, a flame resistant agent, a coupling agent and a coloring agent is utilized. In particular, a mixture composed principally of epoxy resin is utilized in many types of semiconductor devices, because this mixture of epoxy resin has various excellent characteristics.

In a semiconductor device provided with protecting means formed by the transfer molding method using as the molding material a mixture composed principally of epoxy resin, IC and other semiconductor elements and electronic components are completely sealed with resin. As a result, tips and bonding wires of the IC etc. are directly in contact with the resin and accordingly, such a semiconductor device provided with protecting means formed by the resin sealing method has excellent characteristics in moisture resistance, heat conductivity, shock resistance and the like, as compared with a semiconductor device sealed by an airtight sealing method using metal or ceramic.

However, a remarkably high degree of integration of circuits attained recently results in a demand for realizing a semiconductor device having a higher reliability with respect to the above stated characteristics and other characteristics. In order to satisfy such demand, it is necessary: (i) to improve moisture resistance; (ii) to prevent the electronic components from being broken due to curing stress of the sealing material, that is, a resin; (iii) to decrease soft errors in the semiconductor device, caused by X rays radiating from the sealing material; (iv) to prevent falling down of gold wires in the electronic components, which could be caused by a resin having a high viscosity at the time of resin sealing by a transfer molding method; and to take other measures. With a view to complying with these requests in a conventional semiconductor device comprising protecting means formed by a transfer molding method using a mixture of epoxy resin, the purity of resins or bulking agents has been enhanced and the types and mixing quantity of a catalyzer or a surface treatment agent as well as the manufacturing process for resin sealing have been re-examined, which has brought about an improvement of the performance to a certain degree. However, there is a limit in such improvement.

More specifically stated, concerning the improvement of moisture resistance as described above in (i), there are problems as follows. Deterioration due to moisture in a semiconductor device is caused principally by moisture penetrating through two paths, that is, moisture infiltrating a resin layer and moisture penetrating through a surface of contact between the resin layer and the lead wires. The moisture penetrating through these paths dissolves therein impurity contained in the sealing resin, so that the moisture itself is made alkaline or acid. This moisture reaches to the aluminum electrodes formed on the surface of the electronic component, causing corrosion in the aluminum electrodes. For this reason, in order to improve moisture resistance, efforts have been made to improve the purity of resins and bulking agents, re-examine the types and mixing quantity of a catalyzer or a coupling agent, improve the processing method for these materials, etc., and actually, an improvement of the performance has been realized degree. However, as far as a resin permeable by water is used, the moisture penetrating to the surface of the electronic component cannot be completely removed.

Damage or distortion in the electronic components, caused by curing stress of a sealing material, as described above in (ii), can be minimized by decreasing the difference between the coefficient of linear expansion of the material of an electronic component, e.g. a wafer for IC, and that of a resin used as sealing material. The decrease in the difference between the coefficients of linear expansion is generally made by adding a bulking agent such as silica into the resin. However, it is substantially difficult to make no difference exist between the coefficients of linear expansion of the resin and the electronic component by adding a large quantity of bulking agent into the resin. In addition, unfavorably, the bulking agent added for the purpose of decreasing stress contains thorium, uranium and the like, and radioactive rays emitted from these substances, particularly α rays, cause soft errors in the electronic component.

SUMMARY OF THE INVENTION

An object of the present invention is to provide a semiconductor device having an excellent moisture resistance.

Another object of the present invention is to provide a semiconductor device in which electronic components contained therein cannot be damaged by curing stress of a sealing material.

A further object of the present invention is to provide a semiconductor device in which soft errors scarcely occur in the electronic components due to radioactive rays.

Still a further object of the present invention is to provide a semiconductor device which can be easily manufactured without using a press or metallic molds as in a conventional type.

In order to attain the above described objects, the present invention provides a semiconductor device comprising first and second packing means, electronic components provided in a hollow portion formed by connection of the first and second packing means and existing between these packing means, and lead wires interposed in the connecting portion of the first and second packing means and electrically connected with the above described electronic components, extending outside the connecting portion.

The above described first and second packing means each comprise a laminated structure having at least one metallic layer and at least one insulating layer. The interconnection of the above described first and second packing means is made by connecting the peripheral portions of the insulating layers positioned respectively in the end surfaces of the laminated structures.

The insulating layers of the first and second packing means preferably include glass fibers and the like with a thermosetting resin, or a thermoplastic resin.

In a preferred embodiment of the present invention, the above described laminated structure further comprises at least one reinforcing layer.

An advantage of a semiconductor device structured as described above in accordance with the present invention is that the semiconductor device has an excellent moisture resistance.

Another advantage of the present invention is that the electronic components will never be damaged by curing stress of the sealing material.

A further advantage of the present invention is that soft errors in the electronic components scarcely occur due to radioactive rays.

Still a further advantage of the present invention is that the semiconductor device can be easily manufactured without using a press or metallic molds.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
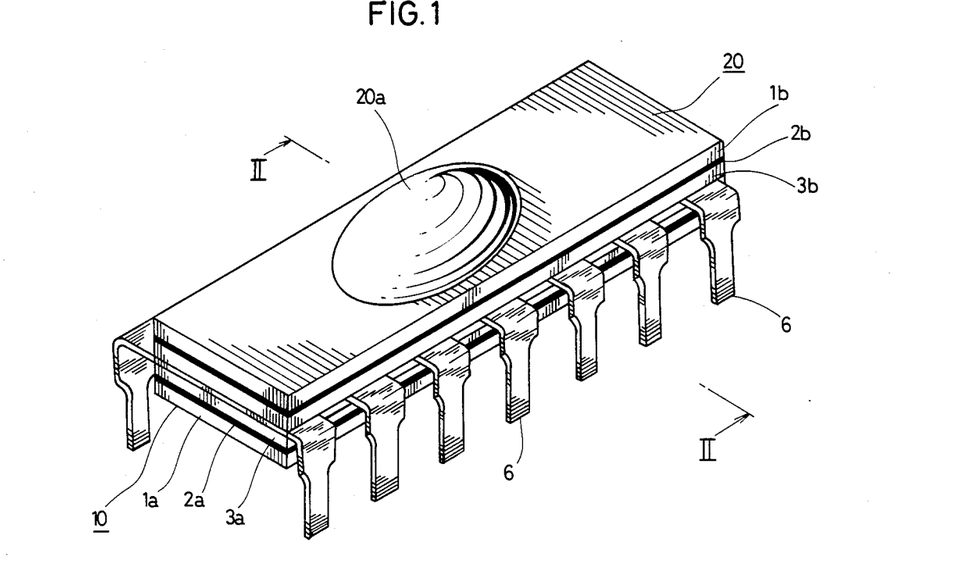
FIG. 1 is a perspective view showing a structure of a semiconductor device of an embodiment in accordance with the present invention.
Figure 2:
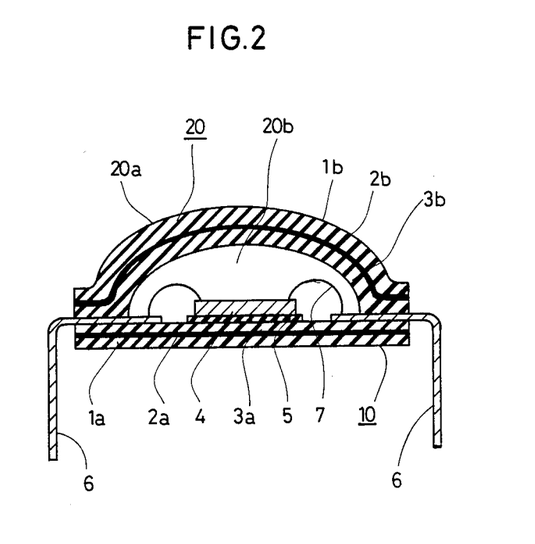
FIG. 2 is a sectional view of the semiconductor device in FIG. 1 taken along the line II—II.

A semiconductor device of a preferred embodiment in accordance with the present invention is shown in FIGS. 1 and 2. The semiconductor device comprises a first protecting member, that is, a packing member 10, an electronic component 4, a second protecting member, that is, a packing member 20 and a plurality of lead wires 6.

The first packing member 10 has a laminated structure comprising a reinforcing layer 1a, a metallic layer 2a and an insulating layer 3a. The reinforcing layer 1a is formed by imbuing glass fiber or the like with synthetic resin such as epoxy resin, and serves principally to maintain mechanical strength of the whole semiconductor device. The metallic layer 2a is formed by providing a metallic foil or metal evaporated film of aluminum or the like on the surface of the reinforcing layer 1a, and serves principally to prevent moisture and to shield from radsioactive rays such as α rays. The insulating layer 3a is formed by providing a high molecular material such as epoxy resin or a complex material of epoxy resin and polyester fiber, etc. on the surface of the above described metallic layer 2a, and serves principally to insulate the electronic component 4 from the exterior and to prevent moisture. The electronic component 4 is, for example, a semiconductor chip of IC and the like and is attached on the surface of the insulating layer 3a of the above described first packing member through a die pad 5. The second packing member 20 has a convex portion 20a and the peripheral portion thereof is fixed to the first packing member. This convex portion 20a is positioned over the electronic component 4 so that a hollow portion 20b is formed to surround the electronic component 4. The second packing member 20 also has a laminated structure comprising a reinforcing layer 1b, a metallic layer 2b and an insulating layer 3b. The reinforcing layer 1b, which serves principally to maintain mechanical strength of the whole semiconductor device, is formed by imbuing glass fiber or the like with synthetic resin such as epoxy resin. The metallic layer 2b, which serves principally to prevent moisture and to shield from radioactive rays such as an α ray, is formed by providing a metallic foil or metal evaporated film of aluminum or the like on the surface of the reinforcing layer 2a. The insulating layer 3b, which serves to insulate the electronic component 4 from the exterior and to protect it from moisture, is formed by providing a high molecular material such as epoxy resin or a complex material of epoxy resin and polyester fiber etc. on the surface of the above described metallic layer 2b. Each of the lead wires 6 has one end exposed to the hollow portion 20b and the other end projecting outside the first and second packing members 10 and 20. These lead wires are fixed in an airtight manner by joining together by fusion the material of the insulating layer 3a of the first packing member and the material of the insulating layer 3b of the second packing member, at the time of fixing the peripheral portions of the first packing member 10 and the second packing member 20. Electrodes (not shown) formed on the surface of the electronic component 4 and the lead wires 6 corresponding thereto are electrically connected by means of bonding wires 7. The bonding wire is a gold wire or aluminum wire whose diameter is several tens of μm.

Since the electronic component 4 is positioned in the hollow portion 20b sealed hermetically by the first packing member 10 and the second packing member 20, the first and second packing members 10 and 20 never touch the electronic component 4. This means that impurity contained in the insulating layers 3a and 3b of the first and second packing members 10 and 20, respectively, never exerts unfavorable influence on the electronic component 4. The unfavorable influence is, for example, corrosion of the aluminum parts contained in the electronic component 4. Furthermore, at the time of manufacturing the semiconductor device, the bonding wires 7 will never be distorted nor broken by contact with the protecting member. In addition, as a result of the above described structure, application of mechanical stress to the electronic component 4 can be prevented. Since the first and second packing members 10 and 20 include respectively metallic layers 2a and 2b, radioactive rays such as $\mu$ rays can be effectively shielded and accordingly, soft errors in the semiconductor device caused by such radioactive rays can be remarkably decreased.

The materials for the respective layers constituting the first and second packing members 10 and 20 are not limited to the above described materials and may be the materials indicated in the following. The thickness of these layers is also indicated in the following.

(a) Reinforcing layers 1a and 1b
 (i) Fiber of glass, ceramic, asbestos, mica, metal, paper or the like
 (ii) Sheet imbued with one thermosetting resin or more. The thermosetting resins to be used are for example as follows: epoxy resin, silicone resin, phenol resin, diallyl patalate resin, melamine resin, unsaturated polyester resin, and polyurethane resin.
 (iii) Film of a thermoplastic resin or combination of such film and the above stated fiber or thermosetting resin. The thermoplastic resin is for example as follows: polyethylene, polypropylene, polyvinyl acetal, ethylene 4-fluoride, polyphenylene sulfide, polyvinyl chloride, polystyrene, acrylic, polyvinyl alcohol, polyether ether ketone, polyimide, polyamide imide, polyamide, polysulfone, polycarbonate, saturated polyester.

The materials described above in (i), (ii) or (iii) are to be used for a single layer or a laminated structure. the thickness of a reinforcing layer is not specifically limited to a certain value, but preferably, it is from 0.1 micron to 5000 microns.

(b) Metallic layers 2a and 2b *Aluminum, copper, gold, iron, stainless steel, tin, lead, titanium, cobal, nickel, tungsten, antimony, hastelloy, inconel, zinc, magnesium and alloys thereof*

These metals or alloys are to be used as a single-layer metallic foil or as a laminated structure comprising a plurality of metallic foils of the same kind or different kinds. The thickness of a metallic layer is not specifically limited to a certain value, but preferably, it is from 1 micron to 3000 microns.

(c) Insulating layers 3a and 3b
It is desired to use an organic material emitting little quantity of radioactive rays. Such organic material is for example as follows:
Fiber or film of polyester, polyamide, polyethylene, polypropylene, ethylene 4-fluoride, polyimide, polyacetal, polyvinyl chloride, polycarbonate, polysulfin, polyether ether ketone, polyphenylene sulfide and cellulosic material such as paper and the like.

These materials may be used singly or together with a thermosetting resin. Such thermosetting resin is for example as follows:
Epoxy resin, silicone resin, unsaturated polyester resin, phenol resin, melamine resin, diallyl phtalate resin, urea resin, and polyurethane resin.

The thickness is not specifically limited, but preferably it is from 0.1 micron to 3000 microns.

The materials shown above in (a) to (c) were indicated by way of example only, and should not be taken in a limitative sense.

In the above described embodiment, the first and second packing members 10 and 20 each have a three-layer structure comprising a reinforcing layer, a metallic layer and an insulating layer. However, depending on the type of the electronic component 4 and the characteristics required for it, other structures may be adopted. For example, a two-layer structure of a metallic layer and an insulating layer, a four-layer structure, a five-layer structure or the like may be used. As far as the first and second packing members 10 and 20 are respectively of a laminated structure having a metallic layer and an insulating layer, a semiconductor device comprising such packing member is included in the present invention. The order of arrangement of the layers in the case of a three-layer structure is not limited to the above described example. For example, a three-layer structure having a metallic layer as the outermost layer, a reinforcing layer as the intermediate layer and an insulating later as the innermost layer may be adopted. The structure of the first packing member 10 and that of the second packing member 20 may be made different.

In addition, the hollow portion 20b may be filled with gas. The gas to be used therein is for example a gas as indicated below:
Inert gas such as helium, neon, argon, xenon, krypton and the like or nitrogen gas.

A hygroscopic material may be filled in the hollow portion 20b, or the wall of the hollow portion 20b may be coated with such material. As such hygroscopic material, the following materials, for example, may be used:
Silica gel, cobalt chloride, phosphorus pentoxide, polyvinyl alcohol and cellulosic material.

Such filling or coating serves to further improve the performance of a semiconductor device in accordance with the present invention.

Now, a method of manufacturing of a semiconductor device shown in FIGS. 1 and 2 will be described. This semiconductor device can be manufactured by compression molding, inflation molding, forced molding or vacuum molding and the like. By using any one of these molding methods, a semiconductor device having a sufficient performance can be obtained. However, a more preferred manufacturing method provided by the inventors of the present invention will be described in the following.

Figure 3:
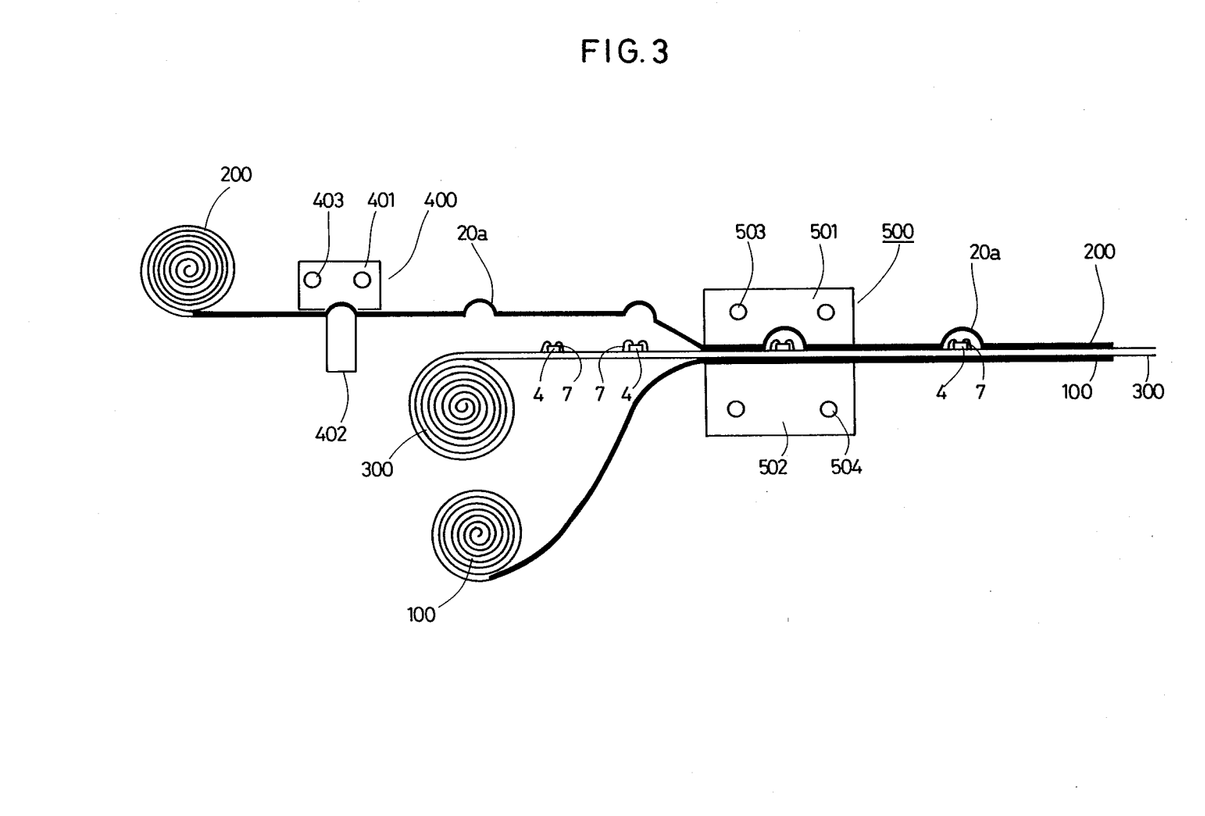
FIG. 3 is a view for explaining a method of manufacturing the semiconductor device shown in FIGS. 1 and 2.

FIG. 3 shows a typical view of a manufacturing system of a semiconductor device shown in FIGS. 1 and 2. Referring to FIG. 3 as well as FIGS. 1 and 2, a first packing member sheet 100 for forming a first packing member 10 of this semiconductor device, a second packing member sheet for forming a second packing member 20 and a lead frame sheet 300 for forming lead wires 6 and die pads 5 are shown. The first packing member sheet 100 has a three-layer laminated structure comprised of a reinforcing layer 1a, a metallic layer 2a and an insulating layer 3a, corresponding to the structure of the first packing member 10. The second packing member sheet 200 has also a three-layer laminated structure comprised of a reinforcing layer 1b, a metallic layer 2b and an insulating layer 3b, corresponding to the structure of the second packing member 20. These three kinds of sheets are respectively wound in the form of a roll so as to be prepared for the manufacturing process.

These rolls are gradually unwound, at the time of manufacturing semiconductor devices, so as to be extended in the direction shown by the arrow A in FIG. 3. In the moving path of the second packing member sheet 200, a convexity forming device 400 for forming a convex portion 20a of the second packing member 20 is provided. In a position where these three kinds of sheets are made to overlap, a fixing device 500 for fixing these sheets is provided. The convexity forming device 400 comprises an upper mold 401 having a spherical concavity, a lower mold 402 opposed to the upper mold 401 and having a spherical convexity fitted to the above stated concavity, and a heater 403 for heating the above stated upper mold 401. The fixing device 500 comprises an upper mold 501 having a spherical concavity corresponding to the convex portion 20a formed in the second packing member sheet 200, a lower mold 502 opposed to the upper mold 501 and heaters 503 and 504 respectively attached to the upper mold 501 and the lower mold 502.

In the manufacturing process, first, the second packing member sheet 200 is inserted between the upper mold 401 and the lower mold 402 of the concavity forming device 400. This second packing member sheet 200 is pressed between the upper mold 401 heated by the heater 403 and the lower mold 402, so that a convex portion 20a is formed in the second packing member sheet 200. This pressing operation is made intermittently while the second packing member sheet 200 is sent, whereby convex portions 20a are successively formed in the second packing member sheet 200 at predetermined intervals. On the other hand, the lead frame sheet 300 is gradually unwound, so that die bonding operation and wire bonding operation for electric components 4 are made on the surface thereof. As a result, electronic components 4 are attached successively on the surface of the lead frame sheet 300 at predetermined intervals. Each electronic component 4 is formed on a die pad 5 of the lead frame sheet 300. The intervals at which the electronic components 4 are formed are the same as the intervals at which the convex portions 20a are formed on the second packing member sheet 200. Then, the second packing member sheet 200 having convex porions 20a, the lead frame sheet 300 with electronic components 4 formed thereon and the first packing member sheet 100 are put together in an overlapping manner in this order, so that the overlapping sheets are inserted between the upper mold 501 and the lower mold 502 of the fixing device 500. Since the convex portion 20a of the second packing member sheet 200 is to cover up the electronic component 4 in a state where a hollow portion 20b is formed over the electronic component 4 as shown in FIG. 2, the relative positioning between the second packing member sheet 200 and the lead frame sheet 300 is adjusted so that each convex portion 20a may be positioned just above the corresponding electronic component 4 and bonding wire 7 and each convex portion 20a may not touch them to cause deformation thereto at the time of fixing. The upper mold 501 and the lower mold 502 of the fixing device 500 are heated by the heaters 503 and 504, respectively, at the temperature 100° to 250° C. This temperature is suited for curing the epoxy resin included in the insulating layers 3a and 3b of the first and second packing members. The above described three kinds of sheets put together in an overlapping manner move in the direction of the arrow A, and when one of the convex portions 20a of the second packing member sheet 200 arrives just below the concave portion of the upper mold 501, the upper mold 501 and the lower mold 502 operate to press these overlapping sheets, whereby the first and second packing member sheets 100 and 200 are heated and respectively fixed, by application of pressure, to the upper and lower surfaces of the lead frame sheet 300, respectively. Thus, these three kinds of sheets are stuck together in the state where the electronic component 4 is disposed inside the hollow portion 20b covered with the convex portion 20a of the second packing member sheet. At this time, since the thickness of the lead frame sheet 300 is as small as 0.5 mm and the epoxy resin contained in the insulating layers 3a and 3b of the first and second packing member sheets 100 and 200 is sufficiently softened by heating and application of pressure, these insulating layers are joined together by fusion so that the lead frame sheet 300 is completely sealed in an airtight manner. Thus, airtight sealing of the electronic component 4 is realized. The above described pressure fixing operation is made intermittently, that is, each time a convex portion 20a arrives just below the concave portion of the upper mold 501. The three kinds of sheets thus stuck together by fusion to be one body are moved in the direction of the arrow A so as to be cut. By bending the lead wires into a desired form, a semiconductor device shown in FIGS. 1 and 2 is obtained.

Now, the performance of a semiconductor device in accordance with an embodiment of the present invention will be described as compared with the performance of a conventional semiconductor device.

Conventional Semiconductor Device

Figure 4:
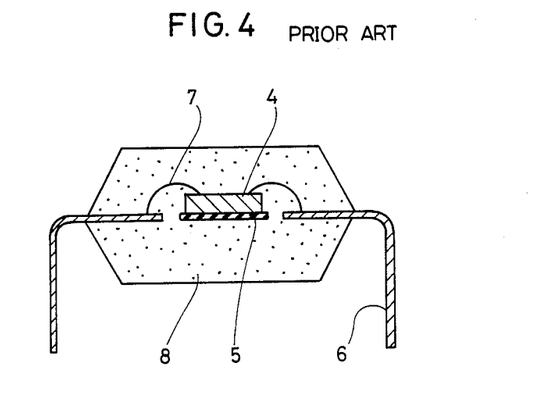
FIG. 4 is a sectional view of a conventional semiconductor device.

FIG. 4 shows a sectional view of a conventional semiconductor device sealed with a sealing resin 8. The semiconductor devices used in the below described tests were manufactured by using EME500 (made by Sumitomo Bakelite Co., Ltd. in Chiyoda-ku, Tokyo, Japan) as the sealing resin 8 and bipolar type ICs, C51521, C53206 and a MOS IC, C5G1400 (all made by Mitsubishi Electric Corp. in Chiyoda-ku, Tokyo, Japan) as the electronic components 4.

Concerning the above described conventional semiconductor devices, the following four tests were made. In each of the tests, one hundred semiconductor devices were used.

I. Moisture Resistant Test (referred to hereinafter as the test 1)

Semiconductor devices are exposed to the atmosphere under the conditions of temperature 120° C., atmospheric pressure of 2 atm and humidity 100% for 5000 hours.

II. Heat Cycle Test (referred to hereinafter as the test 2)

Semiconductor devices are exposed to the temperature of −55° C. for 30 minutes and then exposed to the temperature of 125° C. for 30 minutes. This cycle is repeated 200 times.

III. Heat Shock Test (referred to hereinafter as the test 3)

Semiconductor devices are exposed to the temperature of −190° C. for 5 minutes and then exposed to the temperature of 260° C. for 5 minutes. This cycle is repeated 50 times.

IV. Moisture Resistant Reverse Bias Test (referred to hereinafter as the test 4)

Reverse voltage of 10 volts is applied to semiconductor devices in the atmosphere under the conditions of temperature 120° C., atmospheric pressure of 2 atm and humidity 100% and this state is maintained for 100 hours.

These tests were made using the conventional semiconductor devices structured as described above and as a result, percentage of defectiveness in each of the tests was found as shown in the following table.

TABLE 1

|  |  | Electronic Parts 4 | Test 1 | Test 2 | Test 3 | Test 4 |
|---|---|---|---|---|---|---|
| Conventional Device | 1 | C51521 | 50% | 50% | 80% | 60% |
|  | 2 | C53206 | 60% | 60% | 80% | 58% |
|  | 3 | C5G1400 | 70% | 80% | 95% | 70% |

EMBODIMENTS 1 to 3

The above described tests were made as to the semiconductor device having the structure shown in FIG. 2, using the below described materials for the respective portions. In each of tests, one hundred semiconductor devices were used.

(1) Reinforcing layers 1a and 1b of the first and second packing members 10 and 20 . . . Glass fiber RH600-AA(made by Asahi Fiber Glass Co., Ltd., Japan) imbued with epoxy resin ESCN220HH (made by Sumitomo Chemical Co., Ltd. in Osaka City, Osaka Prefecture, Japan)

(2) Metallic layers 2a and 2b of the first and second packing members 10 and 20 . . . Aluminum foil of 25 microns in thickness (made by Nihon Seihaku Co., Ltd. in Suita City, Osaka Prefecture, Japan)

(3) Insulating layers 3a and 3b of the first and second packing members 10 and 20 . . . Polyester fiber imbued with epoxy resin ESCN220HH (4) Electronic components 4 . . . Bipolar type IC, C51521 (embodiment 1), C53206 (embodiment 2) and MOS IC, C5G1400 (embodiment 3)

Table 2 shows percents of defectiveness obtained as a result of the above described four tests concerning the semiconductor devices in which the above described materials are used.

TABLE 2

|  |  | Electronic Parts 4 | Test 1 | Test 2 | Test 3 | Test 4 |
|---|---|---|---|---|---|---|
| Preferred Embodiments | 1 | C51521 | 3% | 1% | 1% | 2% |
|  | 2 | C53206 | 3% | 1% | 1% | 2% |
|  | 3 | C5G1400 | 5% | 2% | 5% | 4% |

As is clearly understood from the comparison of Table 1 and Table 2, the semiconductor devices of the embodiments 1 to 3 in accordance with the present invention exhibit by far more excellent characteristics in all the above described four tests as compared with the semiconductor devices of the conventional types 1 to 3. More specifically stated, since metallic layers 2a and 2b made of aluminum foil are provided in the embodiments of the present invention, the moisture resistant characteristic is improved and accordingly, the performance with respect to the moisture resistant test and the moisture resistant reverse bias test is heightened. In addition, since the hollow portion 20b is formed by the convex. portion 20a of the second packing member 20, stress is hardly applied to the electronic component 4, which serves to improve the performance with respect to the heat cycle test and heat shock test. Since the convex portion 20a of the second packing member 20 does not touch the electronic component 4, the aluminum electrodes formed on the surface of the electronic component 4 are hardly subjected to corrosion.

EMBODIMENTS 4 to 10

Concerning the semiconductor device shown in FIG. 3, structured by using the below indicated materials, the above described tests 1 to 4 were made and the percents of defectiveness shown in Table 4 were obtained. Table 3 given below shows combinations of the the materials in the embodiments 3 to 10.

(1) Reinforcing layers 1a and 1b and insulating layers 3a and 3b in the first and second packing members 10 and 20 . . . Material obtained by imbuing or coating a material selected out of the fibers, films or mats as shown below, with the mixture of an epoxy resin and a curing agent selected respectively out of the epoxy resins and curing agents as indicated below.

(a) Epoxy resin . . . novolak-type epoxy resin, ESCN220HH (made by Sumitomo Chemical Co., Ltd. in Osaka Prefecture, Japan), ECON-102 (made by Nihan Kayaku Co., Ltd. in Chiyoda-ku, Tokyo, Japan) DEN438 (made by the Dow Chemical Co., U.S.A.), Epikote 1001 Triglycidylisocyanurate TGlC (made by Shell Oil Co., U.S.A.) or (made by Ciba Geigy A.G., Switzerland)

(b) Curing agent . . . phenol novolak, PSK4300 (made by Gunei Chemical Industry Co., Ltd. in Takasaki City, Gunma Prefecture, Japan) or anhydrous trimellitic acid diamino-diphenyl methane (c) Fiber, film or mat . . . fiber, film or mat of glass or phoyester (2) Metallic layers 2a and 2b of the first and second packing members 10 and 20 . . . Metallic foil of 25 microns in thickness, made of a metal selected among aluminum, copper, stainless steel, lead, gold and iron (3) Electronic component 4 . . . MOS IC, C5G1400

TABLE 3

|  | Reinforcing Layer 1a, 1b | | | Metallic Layer 2a, 2b | | Insulating Layer 3a, 3b | | |
|---|---|---|---|---|---|---|---|---|
|  | Fiber etc. | Epoxy Resin | Curing Agent | Material | Thickness | Fiber etc. | Epoxy Resin | Curing Agent |
| Preferred Embodiments | | | | | | | | |
| 3 | Glass Fiber | ESCN220HH | PSK4300 | Aluminum | 25μ | Polyester Fiber | ESCN220HH | PSK4300 |
| 4 | Polyester Fiber | " | " | " | 25μ | Non Woven Fabric | " | " |
| 5 | Glass Chop | " | " | " | 25μ | Polyamide | " | " |
| 6 | Glass Fiber | EOCN102 | Anhydrous Trimellitic Acid | Stainless Steel | 25μ | Non Woven Fabric | EOCN102 | Anhydrous Trimellitic Acid |
| 7 | Glass Fiber | DEN438 | Diamino-Diphenyl Methane | Copper | 25μ | Non Woven Fabric | DEN438 | Diamino-Diphenyl Methane |

TABLE 3-continued

| | Reinforcing Layer 1a, 1b | | | Metallic Layer 2a, 2b | | Insulating Layer 3a, 3b | | |
|---|---|---|---|---|---|---|---|---|
| | Fiber etc. | Epoxy Resin | Curing Agent | Material | Thickness | Fiber etc. | Epoxy Resin | Curing Agent |
| 8 | Glass Fiber | Epikote 1001 | PSK4300 | Lead | 25μ | Non Woven Fabric | Epikote 1001 | PSK4300 |
| 9 | Glass Mat | ESCN220HH | " | Gold | 25μ | Polyester Fiber | ESCN220HH | " |
| 10 | Non Woven Fabric | TG1C | Anhydrous Trimellitic Acid | Iron | 25μ | Non Woven Fabric | TG1C | Anhydrous Arimellitic Acid |

TABLE 4

| | | Test 1 | Test 2 | Test 3 | Test 4 |
|---|---|---|---|---|---|
| Conventional Device 3 | | 70% | 80% | 95% | 70% |
| Preferred Embodiments | 3 | 5% | 2% | 5% | 4% |
| | 4 | 6% | 3% | 6% | 6% |
| | 5 | 5% | 4% | 8% | 6% |
| | 6 | 4% | 6% | 6% | 5% |
| | 7 | 6% | 4% | 6% | 5% |
| | 8 | 5% | 5% | 7% | 6% |
| | 9 | 6% | 4% | 8% | 7% |
| | 10 | 7% | 4% | 7% | 5% |

As can be seen from Table 4, the semiconductor devices of the embodiments also have excellent characteristics in all the tests, as in the case of the semiconductor devices of the embodiments 1 to 3, compared with the semiconductor device of the conventional type 3. It is understood that the characteristics of the semiconductor devices in accordance with the present invention undergo little influence even if the materials for the reinforcing layers 1a, 1b, the metallic layers 2a, 2b and the insulating layers 3a, 3b of the first and second packing members 10 and 20 are replaced by other materials indicated above. In addition, it will be clearly understood that the same results can be obtained even if combinations other than those shown in Table 3 are adopted for the combinations of the insulating layers 3a and 3b and the reinforcing layers 1a and 1b.

In the above described embodiments 3 to 10, combinations of organic materials are used as the materials for forming the insulating layers 3a and 3b of the first and second packing members 10 and 20, which enables these semiconductor devices to be hardly influenced by the α ray. However, in case where an electronic component not influenced by the α ray such as an IC electronic component with a relatively low degree of integration is used, inorganic material such as glass fiber may be used for the insulating layers 3a and 3b.

EMBODIMENTS 11 to 15

Concerning the semiconductor devices of the embodiments 11 to 15, structured by using the below indicated materials, the above described four tests were made and the percents of defectiveness shown in Table 6 were obtained.

(1) Reinforcing layers 1a and 1b and insulating layers 3a and 3b of the first and second packing members 10 and 20 . . . Film of 1 mm in thickness formed of a material selected from the thermoplastic resins such as polyphenylene sulfide, polyether ether ketone, ethylene 4-fluoride, polypropylene and polyacrylonitrile (2) Materials of the other layers . . . Combinations shown in Table 5

(3) Electronic component and other portions . . . Same as in the embodiments 3 to 10

TABLE 5

| | Reinforcing Layer 1a, 1b | Metallic Layer 2a, 2b | | Insulating Layer 3a, 3b |
|---|---|---|---|---|
| | | Material | Thickness | |
| Preferred Embodiments | | | | |
| 11 | Polyphenylene Sulfide | Aluminum | 25μ | Polyether Etherketone |
| 12 | Polyether Etherketone | Aluminum | 25μ | Polypropylene |
| 13 | Polypropylene | Aluminum | 25μ | Polyphenylene Sulfide |
| 14 | Ethylene 4-Flouride | Aluminum | 25μ | Polyacrylonitrile |
| 15 | Polyphenylene Sulfide | Aluminum | 25μ | Polyphenylene Sulfide |

TABLE 6

| | | Test 1 | Test 2 | Test 3 | Test 4 |
|---|---|---|---|---|---|
| Conventional Device 3 | | 70% | 80% | 95% | 70% |
| Preferred Embodiments | 11 | 10% | 10% | 10% | 8% |
| | 12 | 8% | 10% | 8% | 12% |
| | 13 | 5% | 8% | 10% | 10% |
| | 14 | 10% | 5% | 15% | 11% |
| | 15 | 12% | 10% | 13% | 10% |

As can be seen from Table 6, the semiconductor devices of the embodiments 11 to 15 also have excellent characteristics, as in the devices of the embodiments 3 to 10, as compared with the device of the conventional type 3.

EMBODIMENTS 16 to 19

Concerning the semiconductor devices of the embodiments 16 to 19, manufactured by using the below indicated materials, the tests 1 and 4 were made and the results shown in Table 7 were obtained.

(1) Metallic layers 3a and 3b of the first and second packing members 10 and 20 . . . Aluminum foil of a thickness of 7 microns (embodiment 16), 15 microns (embodiment 17), 100 microns (embodiment 18) or 500 microns (embodiment 19)

(2) Materials and structures of other portions . . . Same as in the device of the embodiment 3

TABLE 7

| | | Test 1 | Test 4 |
|---|---|---|---|
| Conventional Device 3 | | 70% | 70% |
| Preferred Embodiments | 3 | 5% | 4% |
| | 16 | 10% | 12% |
| | 17 | 9% | 10% |
| | 18 | 4% | 4% |
| | 19 | 5% | 4% |

As is seen from Table 7, the semiconductor devices with the thickness of the layers of the first and second packing members 10 and 20 being changed for each embodiment also exhibit excellent characteristics in either of the tests concerning the moisture resistance, as in the case of the device of the embodiment 3, compared with the device of the conventional type 3.

EMBODIMENTS 20 to 25

Figure 5:
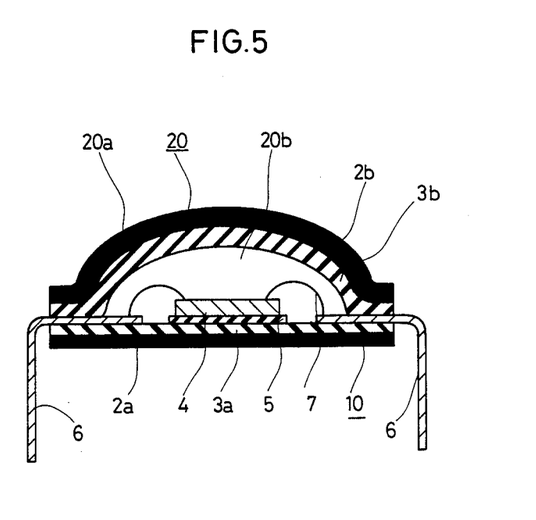
FIGS. 5, 6 and 7 are views showing respectively semiconductor devices of other embodiments in accordance with the present invention.

In the respective devices of the above described embodiments 1 to 3, the first and second packing members 10 and 20 each comprise a three-layer structure having reinforcing layers 1a and 1b, metallic layers 2a and 2b and insulating layers 3a and 3b. On the other hand, in the devices of the embodiments 20 to 25, the first and second packing members each comprise a two-layer structure as shown in FIG. 5. More specifically, two-layer structures respectively comprising metallic layers 2a and 2b and insulating layers 3a and 3b are provided for the first and second packing members 10 and 20, by making the metallic layers 2a and 2b perform also the functions of the reinforcing layers 1a and 1b.

The below indicated materials were used for forming the respective portions of a device and the tests 1 to 4 were made with respect to the semiconductor devices thus formed. The percents of defectiveness obtained by the tests are shown in Table 9.

(1) Metallic layers 2a and 2b of the first and second pacing members 10 and 20 ... Metallic plate of 1 mm in thickness, formed of a metal selected among aluminum, iron, stainless steel, copper, nickel and titanium. The metals used in the respective embodiments are shown in Table 8.

(2) Insulating layers 3a and 3b of the first and second packing members 10 and 20 ... Combination of non woven fabrics, ESCN220H and PSK4300

(3) Materials and structures of other portions ... Same as in the device of the embodiment 3, except that the reinforcing layers 1a and 1b as in the embodiment 3 are not provided specially.

TABLE 8

| | Metallic Layer 2a, 2b | | Insulating Layer 3a, 3b | | |
|---|---|---|---|---|---|
| | Material | Thickness | Fiber etc. | Epoxy Resin | Curing Agent |
| Preferred Embodiments | | | | | |
| 20 | Aluminum | 1 mm | Non Woven Fabric | ESCN220HH | PSK4300 |
| 21 | Iron | 1 mm | Non Woven Fabric | " | " |
| 22 | Stainless Steel | 1 mm | Non Woven Fabric | " | " |

TABLE 8-continued

| | Metallic Layer 2a, 2b | | Insulating Layer 3a, 3b | | |
|---|---|---|---|---|---|
| | Material | Thickness | Fiber etc. | Epoxy Resin | Curing Agent |
| 23 | Copper | 1 mm | Non Woven Fabric | " | " |
| 24 | Nickel | 1 mm | Non Woven Fabric | " | " |
| 25 | Titanium | 1 mm | Non Woven Fabric | " | " |

TABLE 9

| | | Test 1 | Test 2 | Test 3 | Test 4 |
|---|---|---|---|---|---|
| Conventional Device 3 | | 70% | 80% | 95% | 70% |
| Preferred Embodiments | 3 | 5% | 2% | 5% | 4% |
| | 20 | 5% | 5% | 4% | 5% |
| | 21 | 6% | 5% | 6% | 10% |
| | 22 | 5% | 6% | 5.5% | 8% |
| | 23 | 7% | 6% | 6% | 8.9% |
| | 24 | 5% | 6% | 4% | 6.3% |
| | 25 | 5% | 6% | 6% | 6% |

As is understood from Table 9, the semiconductor devices of the embodiments 20 to 25 also have excellent characteristics as compared with the device of the conventional type 3, and such excellent characteristics can be obtained independently of the nature of metal used for the metallic layers 2a and 2b of the first and second packing members 10 and 20.

EMBODIMENTS 26 to 33

Figure 6:
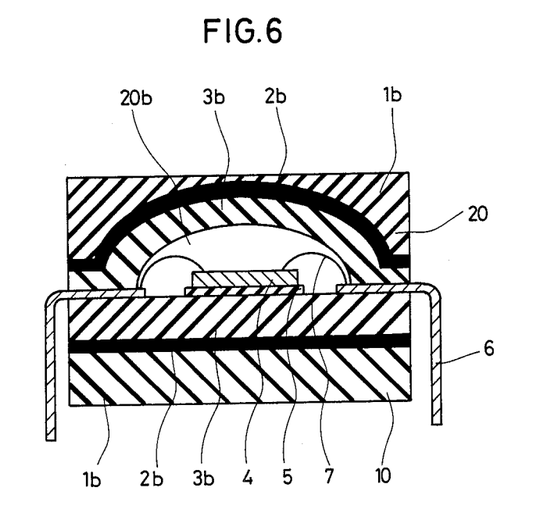

In these embodiments, as shown in FIG. 6, the thickness of the first packing member 10 is larger than that of the first packing member of the device shown in FIGS. 1 and 2, say, approximately 1.6 mm, and a hollow portion is formed on the side of the insulating layer 3b of the second packing member 20, the reinforcing layer 1b having a plane surface. This plane surface of the reinforcing layer 1b is obtained by forming a convex portion in the second packing member sheet 200 by means of the convexity forming device 400 shown in FIG. 3 and flattening the convex portion of the reinforcing layer 1b so as to make plane the whole surface of the reinforcing layer 1b.

Concerning the semiconductor devices in which the combinations of materials shown in Table 10 are used for the reinforcing layers 1a and 1b, metallic layers 2a and 2b and insulating layers 3a and 3b, the reinforcing layer 1b is made plane as described above and the same materials and structures as in the embodiment 3 are adopted for the other portions, the tests 1 to 4 were performed and the percents of defectiveness obtained as the results of the tests are shown in Table 11.

TABLE 10

| | Reinforcing Layer 1a, 1b | | | Metallic Layer 2a, 2b | | Insulating Layer 3a, 3b | | |
|---|---|---|---|---|---|---|---|---|
| | Fiber etc. | Epoxy Resin | Curing Agent | Material | Thickness | Fiber etc. | Epoxy Resin | Curing Agent |
| Preferred Embodiments | | | | | | | | |
| 26 | Glass Fiber | ESCN220HH | PSK4300 | Aluminum | 25μ | Polyester Fiber | ESCN220HH | PSK4300 |
| 27 | Polyester Fiber | " | " | " | 25μ | Non Woven Fabric | " | " |
| 28 | Glass | " | " | " | 25μ | Polyamide | " | " |

TABLE 10-continued

|  | Reinforcing Layer 1a, 1b | | | Metallic Layer 2a, 2b | | Insulating Layer 3a, 3b | | |
|---|---|---|---|---|---|---|---|---|
|  | Fiber etc. | Epoxy Resin | Curing Agent | Material | Thickness | Fiber etc. | Epoxy Resin | Curing Agent |
| 29 | Chop Glass Fiber | EOCN102 | Anhydrous Trimellitic Acid | Stainless Steel | 25μ | Non Woven Fabric | EOCN102 | Anhydrous Trimellitic Acid |
| 30 | Glass Fiber | DEN438 | Diamino-Diphenyl Methane | Copper | 25μ | Non Woven Fabric | DEN438 | Diamino-Diphenyl Methane |
| 31 | Glass Fiber | Epikote 1001 | PSK4300 | Lead | 25μ | Non Woven Fabric | Epikote 1001 | PSK4300 |
| 32 | Glass Mat | ESCN220HH | " | Gold | 25μ | Polyester Fiber | ESCN220HH | " |
| 33 | Non Woven Fabric | TG1C | Anhydrous Trimellitic Acid | Iron | 25μ | Non Woven Fabric | TG1C | Anhydrous Arimellitic Acid |

TABLE 11

Figure 7:
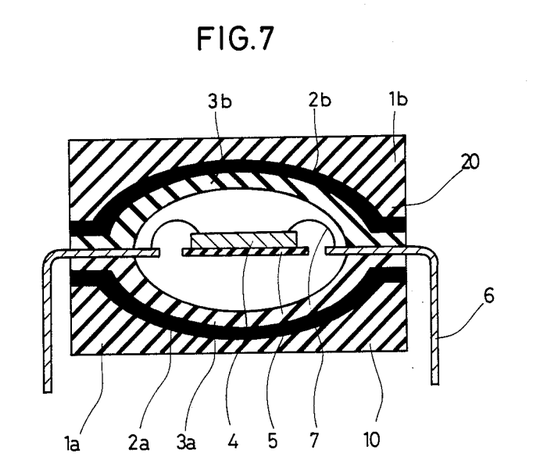

|  |  | Test 1 | Test 2 | Test 3 | Test 4 |
|---|---|---|---|---|---|
| Conventional Device 3 |  | 70% | 80% | 95% | 70% |
| Preferred Embodiments | 3 | 5% | 2% | 5% | 4% |
|  | 26 | 3% | 3% | 4% | 3% |
|  | 27 | 4% | 3% | 5% | 4% |
|  | 28 | 2% | 4% | 6% | 3.6% |
|  | 29 | 5% | 4% | 6.3% | 6% |
|  | 30 | 4% | 5% | 5.5% | 5% |
|  | 31 | 3% | 3% | 6% | 4.4% |
|  | 32 | 4% | 3.4% | 4.5% | 3.8% |
|  | 33 | 4% | 5% | 5% | 7% | nent 4. The respective outside surfaces of the reinforcing layers 1a and 1b are made plane.

Concerning the semiconductor devices in which combinations of materials shown in Table 12 are used for the reinforcing layers 1a and 1b, metallic layers 2a and 2b and insulating layers 3a and 3b, with the reinforcing layers 1a and 1b being made plane as described above, and the same materials and structures as in the embodiment 3 are adopted for the other portions, the tests 1 to 4 were performed and the percents of defectiveness obtained as the results thereof are shown in Table 13.

TABLE 12

|  | Reinforcing Layer 1a, 1b | | | Metallic Layer 2a, 2b | | Insulating Layer 3a, 3b | | |
|---|---|---|---|---|---|---|---|---|
|  | Fiber etc. | Epoxy Resin | Curing Agent | Material | Thickness | Fiber etc. | Epoxy Resin | Curing Agent |
| Preferred Embodiments |  |  |  |  |  |  |  |  |
| 34 | Glass Fiber | ESCN220HH | PSK4300 | Aluminum | 25μ | Polyester Fiber | ESCN220HH | PSK4300 |
| 35 | Polyester Fiber | " | " | " | 25μ | Non Woven Fabric | " | " |
| 36 | Glass Chop | " | " | " | 25μ | Polyamide | " | " |
| 37 | Glass Fiber | EOCN102 | Anhydrous Trimellitic Acid | Stainless Steel | 25μ | Non Woven Fabric | EOCN102 | Anhydrous Trimellitic Acid |
| 38 | Glass Fiber | DEN438 | Diamino-Diphenyl Methane | Copper | 25μ | Non Woven Fabric | DEN438 | Diamino-Diphenyl Methane |
| 39 | Glass Fiber | Epikote 1001 | PSK4300 | Lead | 25μ | Non Woven Fabric | Epikote 1001 | PSK4300 |
| 40 | Glass Mat | ESCN220HH | " | Gold | 25μ | Polyester Fiber | ESCN220HH | " |
| 41 | Non Woven Fabric | TG1C | Anhydrous Trimellitic Acid | Iron | 25μ | Non Woven Fabric | TG1C | Anhydrous Arimellitic Acid |

As can be seen from Table 11, the semiconductor devices of the embodiments 26 to 33 also exhibit eminently excellent characteristics in all the test, a compared with the device of the conventional type 3.

EMBODIMENTS 34 to 41

In these embodiments, as shown in FIG. 7, the first and second packing members 10 and 20 both have a thickness larger than that of the first packing member and the second packing member of the device shown in FIGS. 1 and 2, and the thickness in these embodiments 34 to 41 is for example 1.6 mm. A convex portion is provided respectively in the first and second packing members 10 and 20, whereby a hollow portion is formed to extend over and under the electronic compo-

TABLE 13

|  |  | Test 1 | Test 2 | Test 3 | Test 4 |
|---|---|---|---|---|---|
| Conventional Device 3 |  | 70% | 80% | 95% | 70% |
| Preferred Embodiments | 3 | 5% | 2% | 5% | 4% |
|  | 34 | 4% | 5% | 5% | 4% |
|  | 35 | 4% | 5.5% | 5% | 4% |
|  | 36 | 4.5% | 4% | 6.7% | 3.8% |
|  | 37 | 5% | 4.6% | 7% | 5% |
|  | 38 | 3.8% | 5% | 5% | 4.8% |
|  | 39 | 6% | 6% | 6% | 6% |
|  | 40 | 5.8% | 6.2% | 6.2% | 7% |
|  | 41 | 6% | 4.8% | 4.9% | 5% |

As can be seen from Table 13, the semiconductor devices of the embodiments 34 to 41 also exhibit eminently excellent characteristics in all the tests as in the device of the embodiment 3, compared with the device of the conventional type 3.

EMBODIMENT 42

This embodiment 42 is a semiconductor device in which a 64K dynamic RAM not coated with any organic material is used as the electronic component 4 and the same structures as in the embodiments 1 to 3 are adopted for the other portions.

One hundred devices of this type were manufactured and after they were left for 1000 hours, percentage of occurrence of soft error, that is, soft error ratio in each of them was examined. As a result, it was found that there was no semiconductor device causing soft error.

On the other hand, a soft error ration of 8% was obtained by the examination of the conventional semiconductor devices ("conventional device 4") in which the above described component was used as the electronic component 4 and the same structures as in the conventional types 1 to 3 were adopted for the other portions.

Accordingly, it is understood that a semiconductor device in accordance with the present invention has an excellent performance for prevention of soft error. This is because the first and second packing members 10 and 20 contain respectively the metallic layers 2a and 2b which prevent transmission of the α ray and the materials of the insulating layers 3a and 3b and reinforcing layers 1a and 1b of the first and second packing members 10 and 20 do not include inorganic materials containing uranium or thorium. The semiconductor device of the embodiment 42 shows excellent results in the tests 1 to 4, as in the above described embodiment 1 to 3.

Although an IC was used as an electronic component 4 in the above described embodiment 1 to 42, the same results can be obtained if a diode, a transistor or the like is used. The first packing member 10 and the second packing member 20 may be stuck together using an adhesive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   first packing means comprising a first structure having at least a first metallic layer and at least a first insulating layer, at least one end surface of said first structure being said first insulating layer, said first insulating layer being a glass fiber material and thermosetting epoxy resin, said first metallic layer being aluminum,
   second packing means comprising a second structure having at least a second metallic layer of aluminum and at least a second insulating layer, at least one end surface of said second structure being said second insulating layer, said second insulating layer being a glass fiber material and thermosetting epoxy resin, said first insulating layer and said second insulating layer positioned respectively in said end surfaces of said first and second structures being drawn out and opposed to each other and the respective peripheral portions thereof being connected with each other in an airtight manner, so that said first packing means and said second packing means are connected in a state where an airtight hollow portion is formed therebetween,
   an electronic component comprising a semiconductor element provided inside said hollow portion, and
   at least one lead means interposed in the boundary of connection between said first insulating layer and said second insulating layer positioned respectively in said end surfaces of said first and second structures, one end of said lead means extending into said hollow portion so as to be electrically connected to said electronic component and the other end thereof extending from said boundary of connection to the exterior.

2. A semiconductor device in accordance with claim 1, wherein the thickness of at least either said first metallic layer or said second metallic layer is in the range from 0.1 micron to 3000 microns.

3. A semiconductor device in accordance with claim 1, wherein said hollow portion is filled with insert gas.

4. A semiconductor device comprising:
   first packing means comprising a first structure having at least a first metallic layer of aluminum and at least a first insulating layer, at least one end surface of said first structure being said first insulating layer, said first insulating layer being a thermoplastic resin and a glass fiber material with a thermosetting resin imbued therein,
   second packing means comprising a second structure having at least a second metallic layer of aluminum and at least a second insulating layer, at least one end surface of said second structure being said second insulating layer, said second insulating layer being a thermoplastic resin and a glass fiber material with a thermosetting resin imbued therein, said first insulating layer and said second insulating layer positioned resectively in said end surfaces of said first and second strctures being drawn out and opposed to each other and the respective peripheral portions thereof being connected with each other in an airtight manner, so that said first packing means and said second packing means are connected in a state where an airtight hollow portion is formed therebetween,
   an electronic component comprising a semiconductor element provided inside said hollow portion, and
   at least one lead means interposed in the boundary of connection between said first insulating layer and said second insulating layer positioned respectively in said end surfaces of said first and second structures, one end of said lead means extending into said hollow portion so as to be electrically connected to said electronic component and the other end thereof extending from said boundary of connection to the exterior.

5. A semiconductor device in accordance with claim 4, wherein the thickness of at least either said first metallic layer or said second metallic layer is in the range from 0.1 micron to 3000 microns.

* * * * *